(12) United States Patent
Stoschek et al.

(10) Patent No.: US 7,863,822 B2
(45) Date of Patent: Jan. 4, 2011

(54) OPERATING ELEMENT FOR A VEHICLE

(75) Inventors: Arne Stoschek, Palo Alto, CA (US); Sven Strohband, Mountain View, CA (US)

(73) Assignee: Volkswagen Aktienegesellschaft, Wolfsburg (DE)

( * ) Notice: Subject to any disclaimer, the term of this patent is extended or adjusted under 35 U.S.C. 154(b) by 867 days.

(21) Appl. No.: 11/047,135

(22) Filed: Jan. 31, 2005

(65) Prior Publication Data

US 2005/0200286 A1    Sep. 15, 2005

Related U.S. Application Data

(60) Provisional application No. 60/541,032, filed on Feb. 2, 2004.

(51) Int. Cl.
*B60Q 1/14* (2006.01)

(52) U.S. Cl. .................. 315/77; 315/169.4; 315/78; 345/173

(58) Field of Classification Search .......... 315/77–88, 315/169.3, 169.4; 324/658; 345/173–174
See application file for complete search history.

(56) References Cited

U.S. PATENT DOCUMENTS

| 4,495,820 | A | * | 1/1985 | Shimada et al. .............. 73/724 |
| 4,639,720 | A | * | 1/1987 | Rympalski et al. .......... 345/174 |
| 5,133,934 | A | * | 7/1992 | Denton et al. ................ 422/56 |
| 5,270,689 | A | | 12/1993 | Hermann .................... 345/145 |
| 5,616,844 | A | * | 4/1997 | Suzuki et al. ............ 73/514.32 |
| 5,917,437 | A | | 6/1999 | Ojala ........................... 341/34 |
| 6,373,472 | B1 | * | 4/2002 | Palalau et al. .............. 345/173 |
| 6,556,149 | B1 | * | 4/2003 | Reimer et al. ................ 341/20 |
| 6,586,859 | B2 | | 7/2003 | Kornbluh et al. ........... 310/309 |
| 6,650,345 | B1 | * | 11/2003 | Saito et al. .................. 715/764 |
| 6,657,614 | B1 | * | 12/2003 | Ito et al. ..................... 345/168 |
| 7,126,583 | B1 | * | 10/2006 | Breed ......................... 345/158 |
| 7,159,469 | B2 | * | 1/2007 | Claude et al. ................ 73/756 |
| 7,436,393 | B2 | * | 10/2008 | Hong et al. ................. 345/173 |
| 2002/0054060 | A1 | | 5/2002 | Schena ....................... 345/701 |
| 2002/0078756 | A1 | * | 6/2002 | Akiyama et al. ............ 73/718 |
| 2002/0101176 | A1 | * | 8/2002 | Matsueda ................ 315/169.3 |
| 2002/0122561 | A1 | * | 9/2002 | Pelrine et al. .............. 381/191 |
| 2002/0130673 | A1 | | 9/2002 | Pelrine et al. .............. 324/727 |
| 2002/0130820 | A1 | * | 9/2002 | Sullivan ......................... 345/6 |
| 2003/0067449 | A1 | * | 4/2003 | Yoshikawa et al. ......... 345/173 |
| 2003/0234769 | A1 | * | 12/2003 | Cross et al. ................. 345/173 |
| 2004/0046751 | A1 | | 3/2004 | Heimermann et al. ....... 345/184 |

(Continued)

FOREIGN PATENT DOCUMENTS

DE    197 31 285 A1    1/1999

(Continued)

*Primary Examiner*—Douglas W Owens
*Assistant Examiner*—Tung X Le
(74) *Attorney, Agent, or Firm*—King & Spalding L.L.P.

(57) ABSTRACT

An operating element for a vehicle (1, 160) for operation of a function of vehicle (1, 160), especially by pressing on the operating element or touching the operating element, is designed in such a way that the operating element includes a front electrode (10, 21, 22, 31, 71, 91, 111) and a rear electrode (11, 32, 72), as well as a layer (12, 33, 73) arranged between the front electrode (10, 21, 22, 31, 71, 91, 111) and the rear electrode (11, 32, 72) having a dielectric elastomer.

28 Claims, 21 Drawing Sheets

U.S. PATENT DOCUMENTS

| | | | |
|---|---|---|---|
| 2004/0070316 A1 | 4/2004 | Neubauer et al. | 310/800 |
| 2004/0201878 A1* | 10/2004 | Agrawal et al. | 359/266 |
| 2005/0024342 A1* | 2/2005 | Young | 345/173 |
| 2005/0094394 A1* | 5/2005 | Padiyath et al. | 362/249 |
| 2005/0206623 A1* | 9/2005 | Hein et al. | 345/173 |
| 2005/0273218 A1* | 12/2005 | Breed et al. | 701/2 |

FOREIGN PATENT DOCUMENTS

| | | |
|---|---|---|
| DE | 69511115 T2 | 3/2000 |
| DE | 199 41 960 A1 | 3/2001 |
| DE | 19941960 | 3/2001 |
| DE | 201 02 197 U1 | 7/2001 |
| DE | 20102197 | 7/2001 |
| DE | 201 80 024 U1 | 1/2002 |
| DE | 20180024 | 1/2002 |
| DE | 10139693 | 5/2002 |
| DE | 10151556 | 4/2003 |
| DE | 202004008952 | 11/2004 |
| DE | 102004002825 | 8/2005 |
| DE | 102004013819 | 10/2005 |
| EP | 0366132 | 12/1994 |
| EP | 0893297 | 1/1999 |
| WO | 01/54109 | 7/2001 |
| WO | WO01/54109 | 7/2001 |
| WO | 02/21795 | 3/2002 |
| WO | WO02/21795 | 3/2002 |
| WO | 03044958 | 5/2003 |

* cited by examiner

OPERATING ELEMENT FOR A VEHICLE

PRIORITY

This application claims priority to and is converted from U.S. Provisional Application 60/541,032 filed Feb. 2, 2004.

TECHNICAL FIELD OF THE INVENTION

The present invention relates to an operating element for a vehicle for operation of a function of the vehicle, especially by pressing on the operating element or touching the operating element.

With increasing functionalities of a vehicle, the task is posed to configure displays and operating elements for different functions, so that these can be recognized and operated particularly easily by a driver of a vehicle.

DESCRIPTION OF THE RELATED ART

Different solutions to this problem are known from the prior art. For example, it is proposed, according to WO 02/21795, to design a display or display field in several parts, in which one part of the display field represents an information panel, on which information of the selected menu or the selected function, as well as optionally important information of other function groups, is shown. On the remaining part of the display field, function and/or status displays are clearly generated, so that they are allocated to a corresponding operating element and preferably to the operating element to which the corresponding function is allocated for operation in this selection menu. In addition, one of the functions displayed in the remaining display field and allocated to one of the operating elements is assigned a return function to a higher level menu.

According to DE 101 39 693 A1, multifunction operating elements, by means of which different functions of the connected devices can be operated, have been created in modern electronic devices in a vehicle, which are continually offering additional functions with increasingly more options, because of space limitations for the corresponding operating elements. For example, a multifunctional operating device for vehicles is known from EP 0 366 132 B1, in which choice of the function groups (MENUS) and choice of individual functions occurs by means of a rotary switch, and in which an ENTER function can be initiated, the same bidirectional rotary switch being used for menu selection and individual function selection. This rotary switch then has lock-in positions, to which menus or individual functions are assigned, the ENTER function being initiated by an axial movement of the rotary switch. Such a multifunction operating device is used, for example, to enter the destination of a navigation system. An alpha-numeric keyboard is displayed for this purpose on a display unit, in which the user can move forward and backward by bidirectional movement of the rotary switch. If the cursor is then situated on the desired alpha-numeric character, this can be selected by an axial movement of the rotary switch and transferred to the navigation system. In addition, it is known from DE 199 41 960 A1 to design the operating element as a cylinder rotatable in two directions around its longitudinal axis, which is movable elastically relative to the longitudinal axis.

For comfortable operation and to simplify the tactile characteristics of operation, it is proposed in DE 101 39 693 A1 that a bidirectional rotary element be designed with an axis of rotation running essentially parallel to a vehicle part surface. Bidirectional call-up and/or selection of function groups and/or functions within a menu level then occur by means of the bidirectional rotary element. Selection of the menu levels occurs by a second operating device. The second operating device can be implemented by displacement of the bidirectional rotary element parallel to the axis of rotation of the bidirectional rotary element. Another variant proposes designing the bidirectional rotary element to form the second operating device in the direction of the axis of rotation as a rocker. Another solution proposes that a second operating device be provided, having two operating elements that can be operated preferably parallel to the axis of rotation of the bidirectional rotary element. The second operating device is arranged on or at least partially in the bidirectional rotary element and forms an assembly with the rotary element. In addition, the bidirectional rotary element for call-up and/or selection in two directions is formed on the display device and the second operating device for selection in two additional directions, preferably perpendicular to the selection directions of the bidirectional rotary element.

For clear operation of a technical device, touch screens are known, for example, from DE 201 02 197 U1. A touch screen to display electronic signals and an operating touch input of characters and symbols, consisting of a function level for visualization and key entry and a higher-level, point-like deformable protective level corresponding to it, are disclosed in DE 201 02 197 U1. In this case, during selection of certain points of the function level by touching above the protection level, at least one operating signal for the tactile sense (tactile stimulation) of the user is generated observably on the position of the contact point in the deformed protection level, and the operating signal for the tactile sense (tactile stimulation) is generated by oscillation elements eccentrically arranged within and/or beneath the function level. In addition, in the touch screen known from DE 201 02 197 U1, the generated oscillations are conveyed from the functional level to the protection level by direct contact of the two levels and/or via the edge regions of the levels through rigid or elastic connection elements.

A touch control with tactile feedback for entry of signals in a computer and for output of forces to a user of the touch control is also known from DE 201 80 024 U1 and WO 01/54109 A1, in which the touch control has a touch input device, having a roughly flat contact surface, operated so that it enters a position signal in a processor of the computer based on a position on the contact surface that a user touches, during which the position signal reflects the position in two dimensions. The touch control, according to DE 201 80 024 U1 and WO 01/54109 A1, also has at least one actuator connected to the touch input device, in which the actuator exerts a force on the touch input device, in order to provide a tactile sensation to the user touching the contact surface, in which the actuator outputs the force directly to the touch input device based on force information released by the processor.

An operating element for a device with several selectable menus, functions and/or function values is known from DE 197 31 285 A1, having a surface that can be grasped by the user, and via which selection can be performed by local movement or touching of the surface. The surface is variable in configuration according to the selected and/or selectable menu, function and/or function value.

SUMMARY OF THE INVENTION

The task of the invention is to further improve operation of a vehicle. It is also desirable not to cause a deterioration in customer acceptance (especially in the upper price range), but to increase it, if possible.

The aforementioned task is solved by an operating element for a vehicle for operation of a function of the vehicle, especially by pressing on the operating element or touching the operating element, in which the operating element includes a front electrode and a rear electrode, as well as a layer having an especially nonionic, dielectric elastomer arranged between the front electrode and the rear electrode.

A front electrode according to the invention is especially an electrode that is arranged on one side of the layer having the dielectric elastomer, which faces an operating surface of the operating element, the operating element being operable by pressing on the operating surface and/or touching the operating surface. A rear electrode according to the invention is a special electrode that is arranged on a side of the layer having the dielectric elastomer facing away from the operating surface.

In an advantageous embodiment of the invention, the operating element has at least one pressure sensor, arranged especially on the side of the rear electrode facing away from the layer having the dielectric elastomer, to measure a pressure exerted on the operating surface of the operating element.

In another advantageous embodiment of the invention, the operating element has at least one capacitance measurement device to measure an electrical capacitance formed between the front electrode and the rear electrode.

In another advantageous embodiment of the invention, at least the front electrode is elastic.

In addition, the front electrode and/or rear electrode are advantageously configured flat. Flat, in the sense of the invention, is supposed to mean that the surface of an electrode exceeds in width the surface of the electrode in height by at least ten times. In another advantageous embodiment of the invention, at least the front electrode is configured as a circular or elliptical surface or circular surface, but with at least one straight outside, or as an elliptical surface, but with at least one straight outside.

In another advantageous embodiment of the invention, at least the front electrode is configured as an especially circular or elliptical ring. At least the front electrode can also be configured as an especially circular or elliptical ring with at least one straight inside and/or at least one straight outside.

In another advantageous embodiment of the invention, at least one cover layer is arranged on a side of the front electrode facing away from the layer having the dielectric elastomer, which, in another advantageous embodiment of the invention, is light-conducting or transparent at least in areas. In another advantageous embodiment of the invention, at least one protective layer is arranged on a side of the cover layer facing away from the front electrode.

In another advantageous embodiment of the invention, a control is assigned to the operating element, by means of which the operating element, depending on an operating state of the vehicle, a module of the vehicle and/or a display device assigned to the vehicle, can be raised either three-dimensionally from a visible surface or occluded with the visible surface, so that it is essentially invisible to the user and/or essentially cannot be felt.

Raisable, according to the invention, can include spatial raising and/or spatial lowering. Raised, according to the invention, in particular, means that an operating element is essentially visible and/or essentially palpable to a user. Visible surface, according to the invention, is especially a visible surface without a functionality, i.e., without a display and operating function.

The aforementioned task is also solved by an operating element for a vehicle for operation of a function of the vehicle, especially by pressing on the operating element or touching the operating element, in which the operating element is arranged in a visible surface in the interior of the vehicle, and in which a control is assigned to the operating element, by means of which the operating element, depending on the operating state of the vehicle, a module of the vehicle and/or a display device assigned to the vehicle, can be either raised spatially from the visible surface or occluded with the visible surface, so that it is essentially invisible to the user and/or essentially cannot be felt.

In another advantageous embodiment of the invention, a display device to display the function of the operating element is assigned to the operating element, or the operating element has an especially elastic display device to display the function of the operating element, which is advantageously arranged beneath the operating surface.

The aforementioned task is also solved by an operating element for a vehicle for operation or function of the vehicle by pressing on an operating surface of the operating element or touching the operating element, in which the operating element has at least an elastic display device beneath the operating surface to display the function of the operating element.

In another advantageous embodiment of the invention, the elastic display device is an elastic OLED or contains an elastic OLED. The elastic display device, in another advantageous embodiment of the invention, is arranged in the cover layer.

The vehicle according to the invention is especially a ground vehicle, usable individually in traffic. Vehicles according to the invention are especially not restricted to ground vehicles with an internal combustion engine.

BRIEF DESCRIPTION OF THE DRAWINGS

Additional advantages and details are apparent from the following description of practical examples. In the examples.

DETAILED DESCRIPTION OF THE PREFERRED EMBODIMENTS

Figure 1:
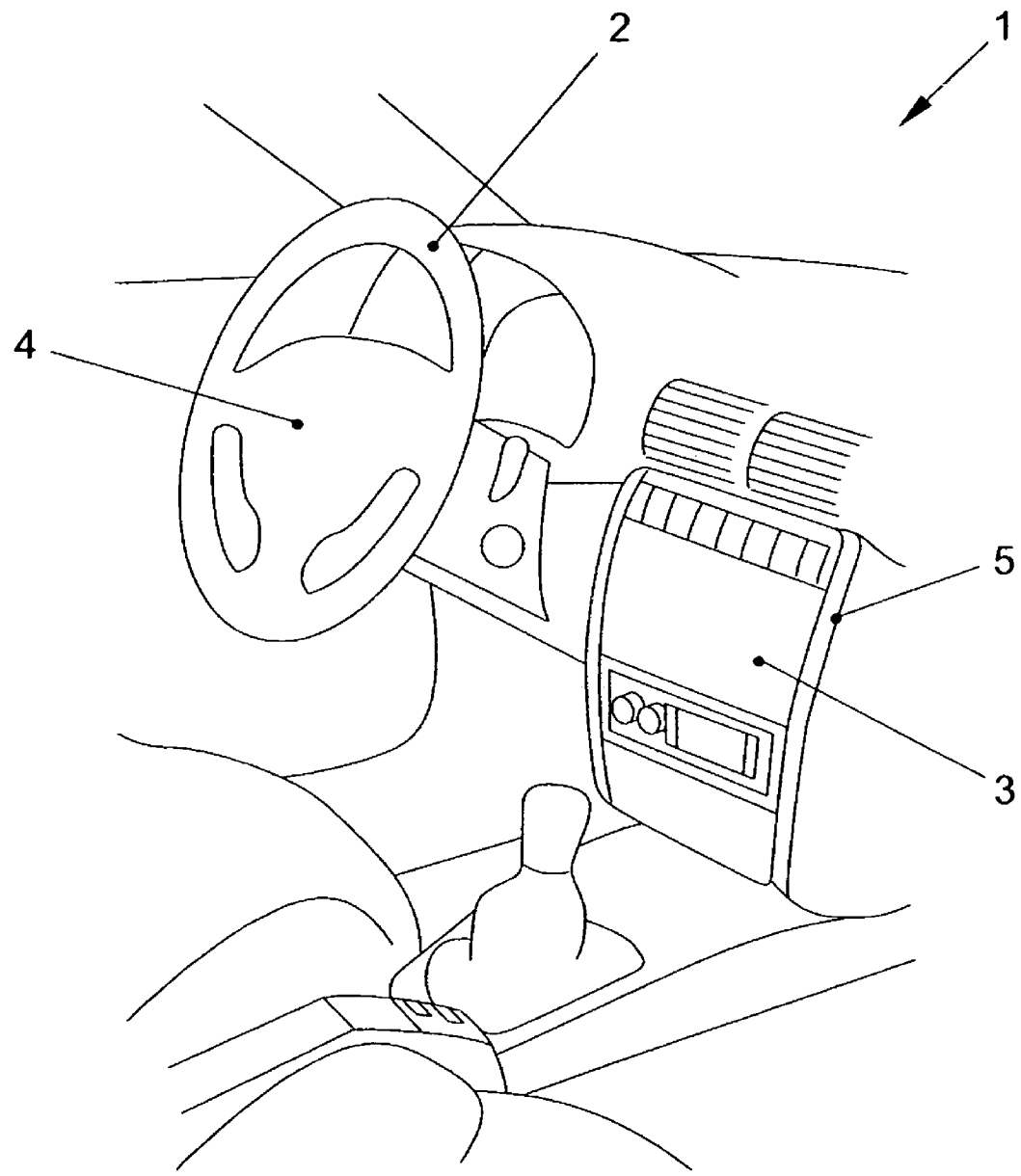
FIG. 1 shows the vehicle in an inside view.

FIG. 1 shows a vehicle 1 in an inside view. Reference number 3 denotes a visible surface on a console 5 and reference number 4 denotes a visible surface on a steering wheel 2. In the visible surface 3 and/or visible surface 4, at least one operating element, not recognizable in FIG. 1, is arranged for operation of a function of the vehicle 1, especially by pressing on the operating element. The operating element is either raisable spatially from the visible surface 3 or 4 in an operating mode and occludable in a rest mode with the visible surface 3 or 4, so that it is essentially invisible for a user and/or essentially cannot be felt, depending on an operating state of the vehicle 1, a module of vehicle 1 and/or a display device assigned to vehicle 1. The operating mode is assumed by the operating element, if a possible or necessary input by a user of the vehicle 1 or another occupant of vehicle 1 is provided by the operating element in the operating state of vehicle 1, the module of vehicle 1 and/or the display device assigned to vehicle 1. The rest mode is then assumed by the operating element, if, in the operating state of vehicle 1, the module of vehicle 1 and/or the display device assigned to vehicle 1, no input is provided by the user of vehicle 1 or the other occupant of vehicle 1 by means of the operating element.

Figure 2:
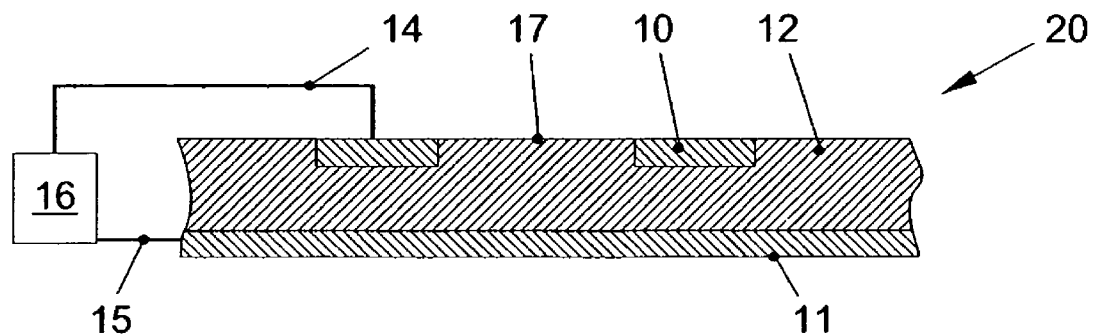
FIG. 2 shows a cross section through a practical example of an operating element in the rest mode.

FIG. 2 shows a cross section through a practical example of an operating element 20 in the rest mode. The operating element 20 includes a front electrode 10 and a rear electrode 11, as well as a layer 12 of especially nonionic, dielectric elastomer arranged between the front electrode 10 and the rear electrode 11. As dielectric elastomer, those mentioned, for example, in the article "Actuation response of polyacrylate dielectric elastomers" by Kofod, Guggi, Kornbluh, Roy D., Pelrine, Ron, Sommer-Larson, Peter, Proc. SPIE, Vol. 4329, pages 141-147 (incorporated by reference) can be used. Particularly suitable elastomers are known, for example, from the articles published under the Internet address robots.mit.edu/publications/PDF/188.pdf, "Hyper-redundant Robot Manipulators Actuated by Optimized Binary Dielectric Polymers" by Andreas Winger, Matthew Lichter, Steven Dubowsky, Moustapha Hafez, Department of Mechanical Engineering, Massachusetts Institute of Technology (incorporated by reference). Other usable elastomers (EAP) are disclosed, for example, in DE 101 51 556 A1 (incorporated by reference), US 2002/0054060 A1 (incorporated by reference), US 2002/0130673 A1 (incorporated by reference) and U.S. Pat. No. 6,586,859 B2 (incorporated by reference).

Figure 3:
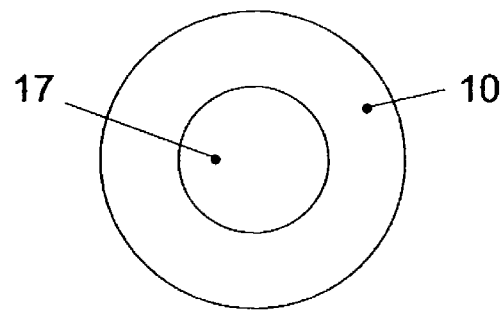
FIG. 3 shows a top view of a practical example of an annular front electrode.

The front electrode 10 and the rear electrode 11 can be supplied with electrical power via feed lines 14 and 15 by means of a controller 16, or a voltage can be applied between them. The feed lines 14 and 15 are only shown schematically in FIG. 2 and not necessarily in their actual position. The front electrode 10 of the operating element 20, according to the practical example of FIG. 2, is configured as a circular ring around an opening 17. The top view of the front electrode 10 depicted in FIG. 3 shows this.

Figure 4:
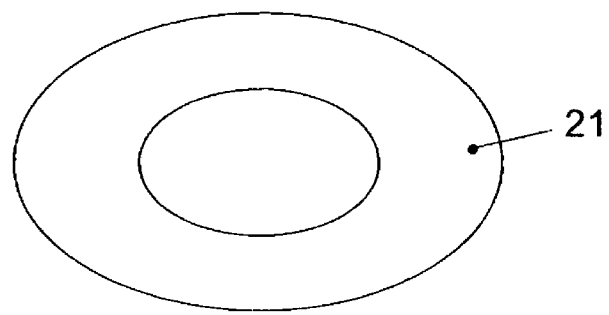
FIG. 4 shows a top view of another practical example of an annular front electrode.
Figure 5:
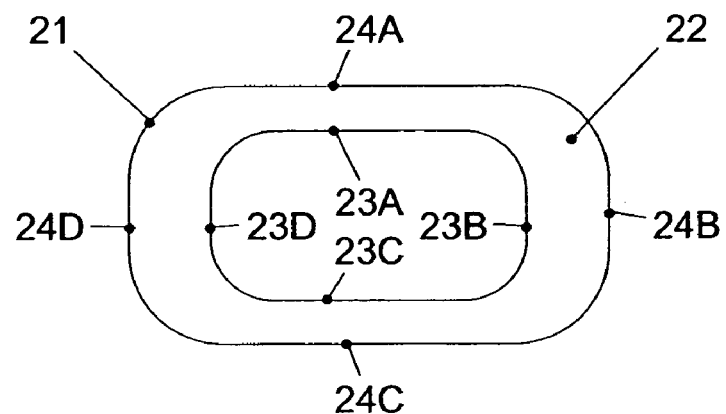
FIG. 5 shows a top view of another practical example of an annular front electrode.

Instead of the front electrode 10 configured as a circular ring, a front electrode 21 configured as an elliptical ring can also be used. FIG. 4 shows a top view of a practical example of such a front electrode 21. Instead of a front electrode configured as a circular or elliptical ring with at least one straight inside and/or at least one straight outside can also be used. FIG. 5 shows a top view of a practical example of such a front electrode 22. The front electrode 22 is then configured as an elliptical ring with four straight insides 23A, 23B, 23C, 23D and four straight outsides 24A, 24B, 24C, 24D.

Figure 6:
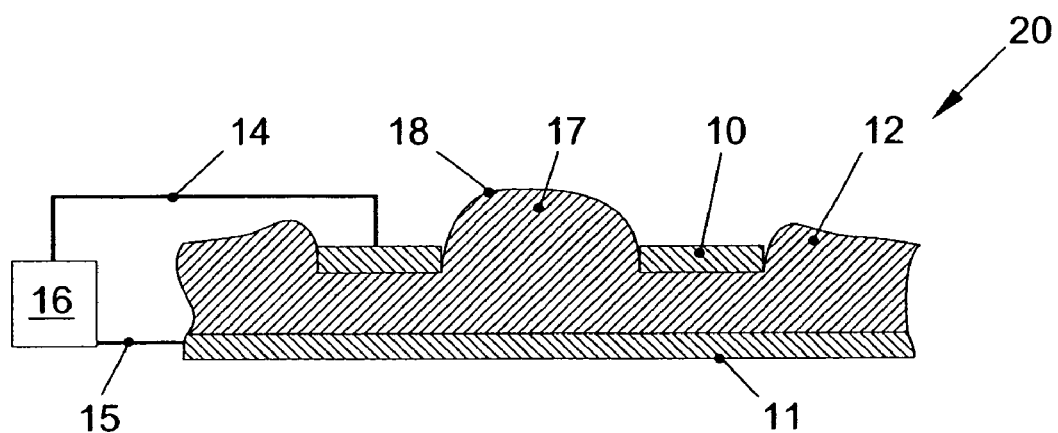
FIG. 6 shows a cross section through the operating element according to FIG. 2 in the operating mode.

By means of control 16, the operating element 20 can be supplied with electrical power and therefore switched back and forth between the rest mode and the operating mode. In the case depicted in FIG. 2 of the operating element 20 in the rest mode, no voltage is applied between the front electrode 10 and the rear electrode 11. In the operating mode, on the other hand, a voltage is applied between the front electrode 10 and the rear electrode 11, which leads to deformation of the layer 12 formed from the dielectric elastomer. FIG. 6 shows a cross section through the operating element 20 according to FIG. 2 in the operating mode. Because of deformation of the layer 12 formed from the dielectric elastomer, a bulge 18 is formed in opening 17, which is recognizable for a user as a key, pushbutton, etc. The operating element 20, in addition, in FIG. 2 and FIG. 6, has means (not shown) for recording or recognizing a pressure on bulge 18. Practical examples of such means are explained by means of the practical examples according to FIG. 9, FIG. 10, FIG. 11 and FIG. 12. The bulge 18 can then be understood as the operating surface according to the present embodiments.

Figure 7:
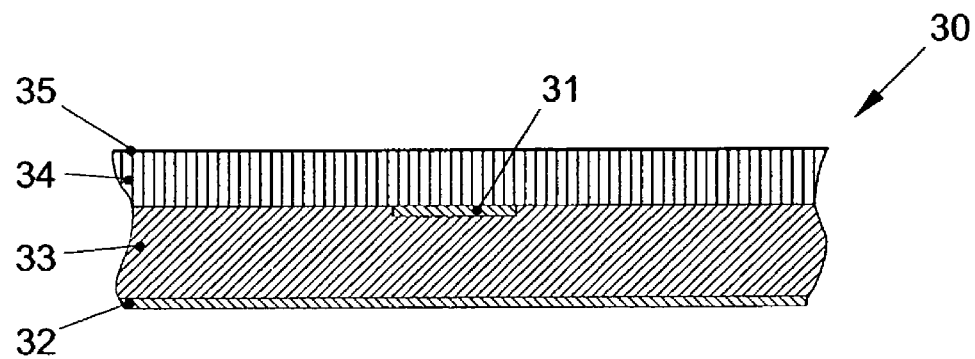
FIG. 7 shows a cross section through another practical example of an operating element in the rest mode.

FIG. 7 shows a cross section through another practical example of an operating element 30 in the rest mode and FIG.

8 shows a cross section through the operating element 30 according to FIG. 7 in the operating mode. The operating element 30 includes a front electrode 31 and a rear electrode 32, as well as a layer 33 arranged between the front electrode 31 and rear electrode 32, consisting of an especially nonionic, dielectric elastomer that corresponds to the dielectric elastomer of layer 12. The front electrode 31 is configured as a circular surface. In addition, at least the front electrode 31 can be deform elastically, so that it (as is apparent by comparison between FIG. 7 and FIG. 8) can expand then into the operating mode with layer 33.

Between the front electrode 31 and the rear electrode 32, a voltage can be applied by means of a control corresponding to control 16 (not shown) via feed lines corresponding to feed lines 14 and 15 (not shown), and therefore switched back and forth between the rest mode and the operating mode. In the case of the operating element 30 in the rest mode, depicted in FIG. 7, no voltage is applied between front electrode 31 and rear electrode 32. In the operating mode, on the other hand, a voltage is applied between the front electrode 31 and the rear electrode 32 that leads to deformation of the layer 33 formed from the dielectric elastomer. Because of deformation of the layer 33 formed from the dielectric elastomer, an operating surface 36, recognizable and feelable, because of a recess, is therefore formed over the front electrode 31, which can be recognized for a user as a key, pushbutton, etc. In addition, because of deformation of layer 33, an annular bulge 37 is formed around the operating surface 36, which aids the user in recognizing it or feeling the operating surface 36 as a key, pushbutton, etc.

At least one cover layer 33 is optionally arranged on the front electrode 31 or layer 33, which reinforces formation of the annular bulge 37. In addition, a protective layer 35 can be provided, which can be partially transparent, on the cover layer 34 (or directly on the front electrode 31 or layer 33). A layer corresponding to cover layer 34 and/or protective layer 35 can also be provided in conjunction with operating element 20.

Figure 8:
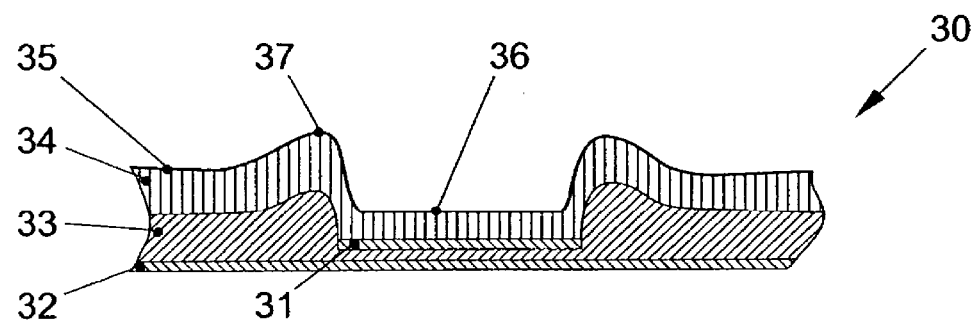
FIG. 8 shows a cross section through the operating element according to FIG. 7 in the operating mode.
Figure 9:
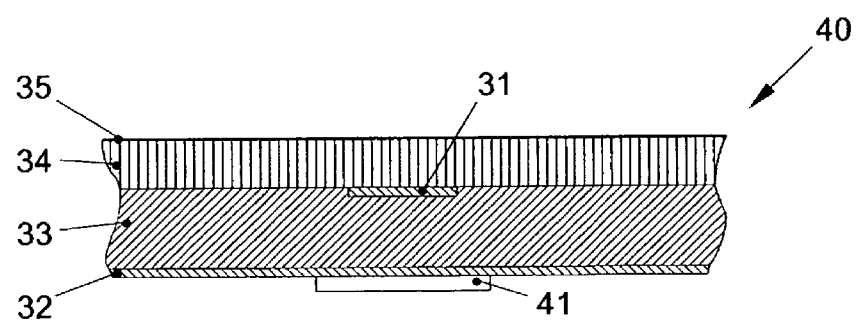
FIG. 9 shows a cross section through another practical example of an operating element in the rest mode.

The operating element 30 in FIG. 7 and FIG. 8 also has means (not shown) to record or recognize pressing of an operating surface 36. Practical examples of such means are explained with reference to the following practical examples. FIG. 9 shows a cross section through another practical example of an operating element 40 in the rest mode, FIG. 10 shows a cross section through the operating element 40 according to FIG. 9 in the operating mode, FIG. 11 shows a cross section through another practical example of an operating element 50 in the rest mode, and FIG. 12 shows a cross section through the operating element 50 according to FIG. 11 in the operating mode, in which, as in all other practical examples of figures, the same reference numbers denote the same or equivalent elements.

Figure 10:
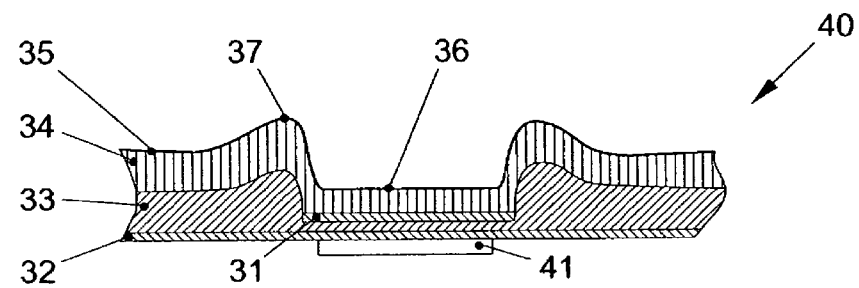
FIG. 10 shows a cross section through the operating element according to FIG. 9 in the operating mode.

Supplementing the operating element 30, depicted in FIG. 7 and FIG. 8, the operating element 40, depicted in FIG. 9 and FIG. 10, has a pressure sensor 41 arranged on the side of the rear electrode 32 facing away from layer 33 for measurement of the pressure exerted on the operating surface 36 by a user. Operation of the operating element 40 (for control) is therefore recognizable by means of this pressure sensor 41.

Figure 11:
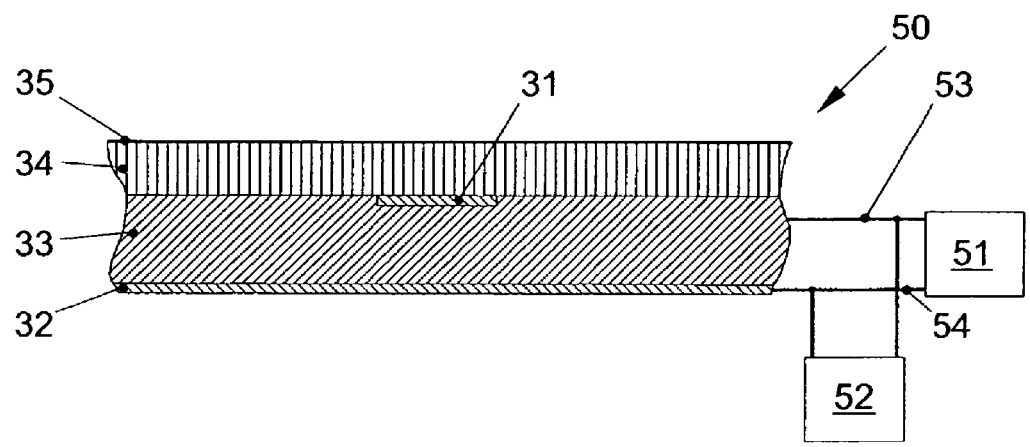
FIG. 11 shows a cross section through another practical example of an operating element in the rest mode.
Figure 12:
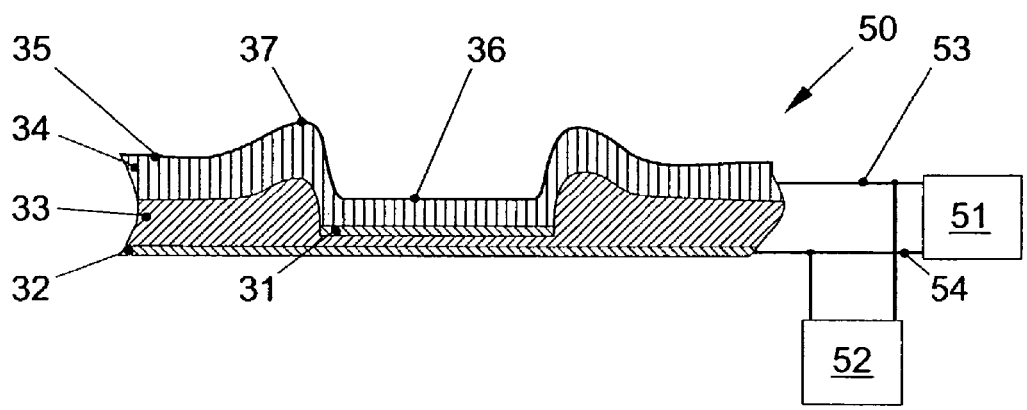
FIG. 12 shows a cross section through the operating element according to FIG. 11 in the operating mode.

As a supplement to the operating element 30, depicted in FIG. 7 and FIG. 8, and as an alternative to the operating element 40, depicted in FIG. 9 and FIG. 10, the operating element 50, depicted in FIG. 11 and FIG. 12, has a capacitance measurement device 52 for measurement of an electrical capacitance formed between the front electrode 31 and the rear electrode 32. In FIG. 11 and FIG. 12, reference number 51 denotes the control not shown in FIG. 7, FIG. 8, FIG. 9 and FIG. 10, and reference numbers 53 and 54 the feed lines not shown in FIG. 7, FIG. 8, FIG. 9 and FIG. 10. The feed lines 53 and 54 are only shown schematically in FIG. 11 and FIG. 12 and not necessarily in their actual position. It can be prescribed to measure a change in voltage between front electrode 31 and rear electrode 32 by means of the capacitance measurement device 51 and, in this way, recognize operation of operating element 50 (for control). The capacitance measurement device 52 and control 51 then cooperate, so that a change in voltage between the front electrode 31 and the rear electrode 32 caused by corresponding operation of control 51 can be distinguished by capacitance measurement device 52 from a change in voltage between the front electrode 31 and the rear electrode 32 caused by a change in the electrical capacitance between front electrode 31 and rear electrode 32 based on operation of the operating element 50 (i.e., based on a pressure exerted on the operating surface 36).

It can be proposed to provide both a pressure sensor 41 and a capacitance measurement device 52 in one operating element.

Figure 13:
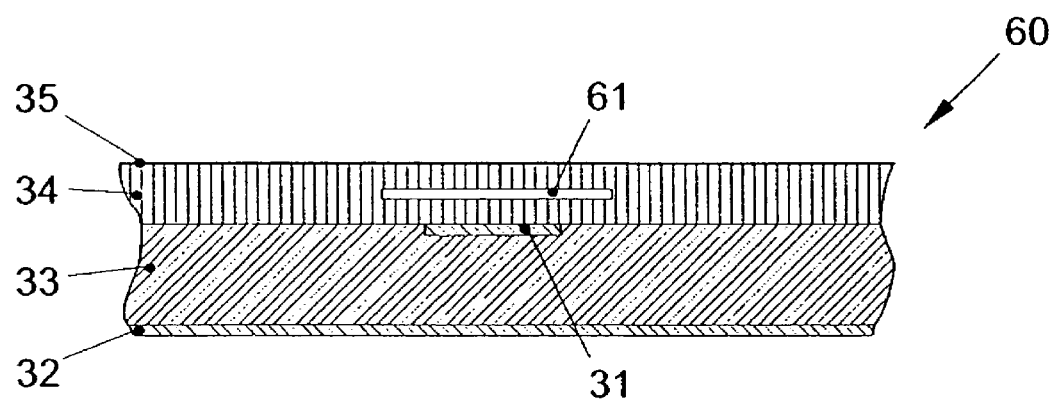
FIG. 13 shows a cross section through another practical example of an operating element in the rest mode.
Figure 14:
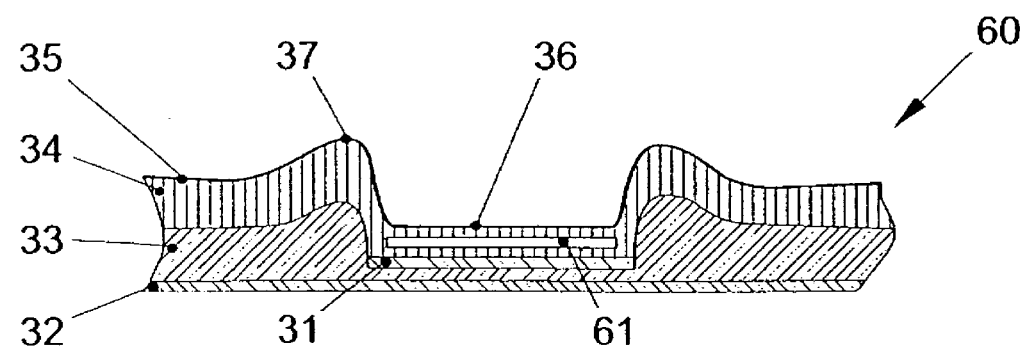
FIG. 14 shows a cross section through the operating element according to FIG. 13 in the operating mode.

FIG. 13 shows a cross section through another practical example of an operating element 60 in the rest mode and FIG. 14 a cross section through the operating element 60 according to FIG. 13 in the operating mode. The operating element 60 can then advantageously be supplemented by the features of operating elements 30, 40 and 50. The operating element 60 has a display device 61, configured especially elastic, especially an elastic OLED, to display the function of operating element 60. It can then be prescribed that the cover layer 34 is configured at least light-conducting in areas or is light transparent. The display device 61 is arranged beneath the operating surface 36.

Figure 15:
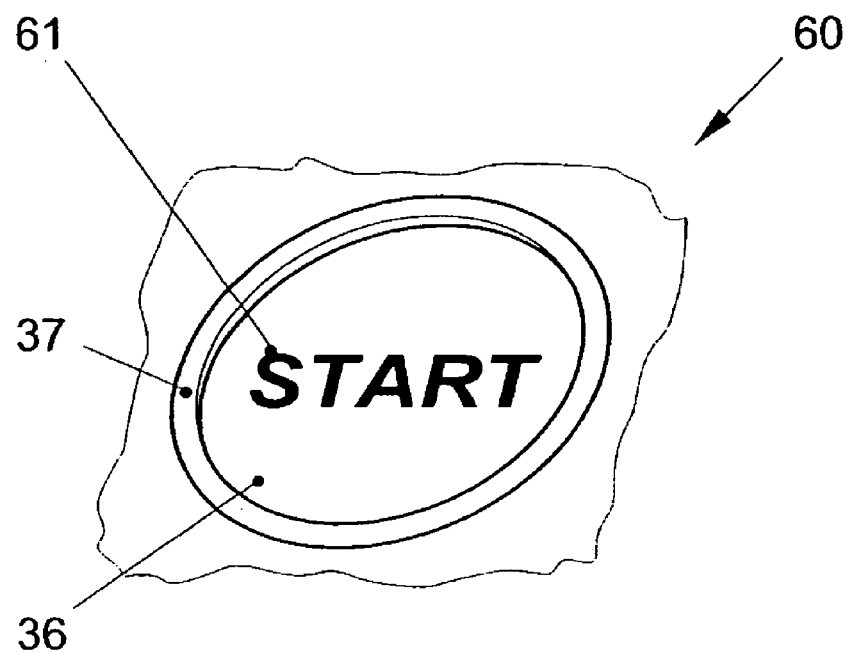
FIG. 15 shows a perspective top view of the operating element according to FIG. 13 in the operating mode.
Figure 16:
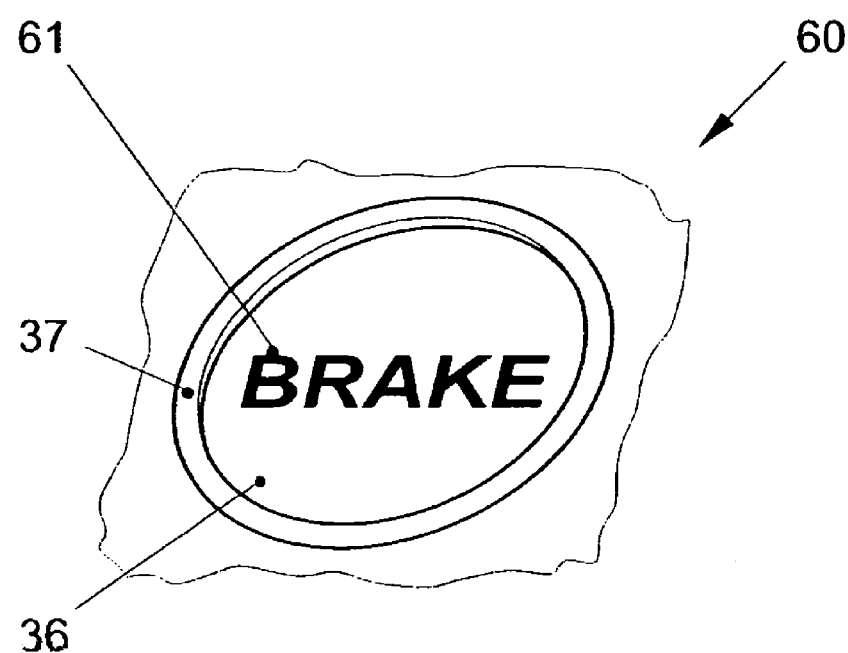
FIG. 16 shows another perspective top view of the operating element according to FIG. 13 in the operating mode.

It is advantageously prescribed that different functions can be displayed by display device 61. In this manner, different functions can be displayed to a user. FIG. 15, for example, shows a perspective top view of operating element 60 according to FIG. 13 in the operating mode, in which the operating element 60 is configured as a start button. In the rest state of vehicle 1, operating element 60 is in the rest state and essentially not recognizable for a user. After insertion of an ignition key in an ignition lock, the operating element 60 is transferred to the operating mode and the word "START" is displayed by a display device 61, which the operating element 60 identifies for a user of the vehicle 1 as a start button. After vehicle 1 is started, as shown in FIG. 16, the word "BRAKE" is displayed by means of display device 61, which identifies the operating element 60 for a user of vehicle 1 with an operating element to apply and/or release a handbrake. After vehicle 1 drives off with the released handbrake, the operating element 60 enters the rest state and is essentially unrecognizable to a user. However, it can also be used for additional functions.

Figure 17:
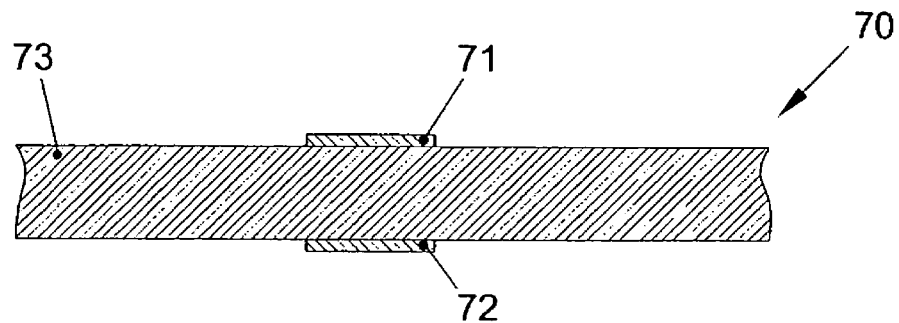
FIG. 17 shows a cross section through another practical example of an operating element in the rest mode.
Figure 18:
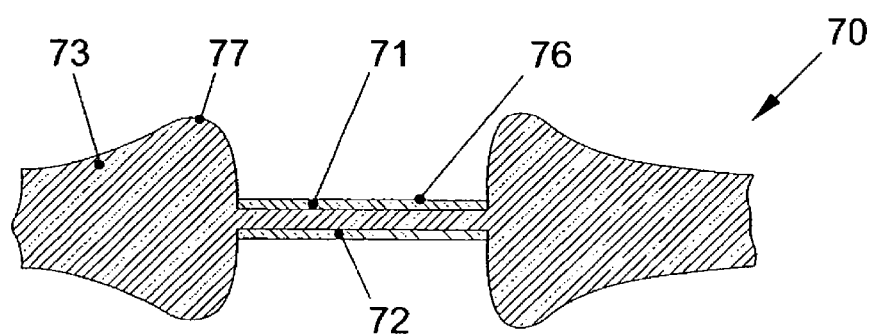
FIG. 18 shows a cross section through the operating element according to FIG. 17 in the operating mode.

FIG. 17 shows a cross section through another practical example of an operating element 70 in the rest mode and FIG. 18 shows a cross section through the operating element 70 according to FIG. 17 in the operating mode. The operating element 70 includes a front electrode 71 and a rear electrode 72, as well as a layer 73 arranged between front electrode 71 and rear electrode 72, consisting of an especially nonionic, dielectric elastomer corresponding to the dielectric elastomer of layer 12. Both the front electrode 71 and the rear electrode 72 are configured as elastic circular surfaces, in which the front electrode 71 and the rear electrode 72, as is recognizable by a comparison between FIG. 17 and FIG. 18, can deform with layer 73 and then expand into the operating mode.

A voltage can be applied between front electrode 71 and rear electrode 72 by means of a control (not shown) corresponding to controls 16 and 51 via lines (not shown) corresponding to lines 14 and 15 or 53 and 54, and switching back and forth between the rest mode and the operating mode therefore carried out. In the case of operating element 70, depicted in FIG. 17 in the rest mode, no voltage is applied between front electrode 71 and rear electrode 72. In the operating mode, on the other hand, a voltage is applied between front electrode 71 and the rear electrode 72, leading to deformation of layer 73 made of a dielectric elastomer. An operating surface 76 that is recognizable for a user as a key, pushbutton, etc., recognizable and touchable via a recess, is then formed by deformation of layer 73 from the dielectric elastomer over the front electrode 71. In addition, from deformation of layer 73, an annular bulge 77 is formed around operating surface 76 that facilitates the user in recognizing or feeling the operating surface 76 as a key, pushbutton, etc.

At least one cover layer, not shown in FIG. 17 and FIG. 18, can be arranged on the front electrode 71 or layer 73 that reinforces formation of the annular bulge 77. In addition, on the cover layer (or directly on the front electrode 71 or layer 73), a protective layer, not shown in FIG. 17 and FIG. 18, can be provided, which can be partially transparent. The operating element 70 also has means, not shown in FIG. 17 and FIG. 18, for recording or recognizing pressure on the operating surface 76, as explained, for example, with reference to FIG. 9, FIG. 10, FIG. 11 and FIG. 12. In addition, the operating element 70 can have a display device corresponding to display device 61.

Figure 19:
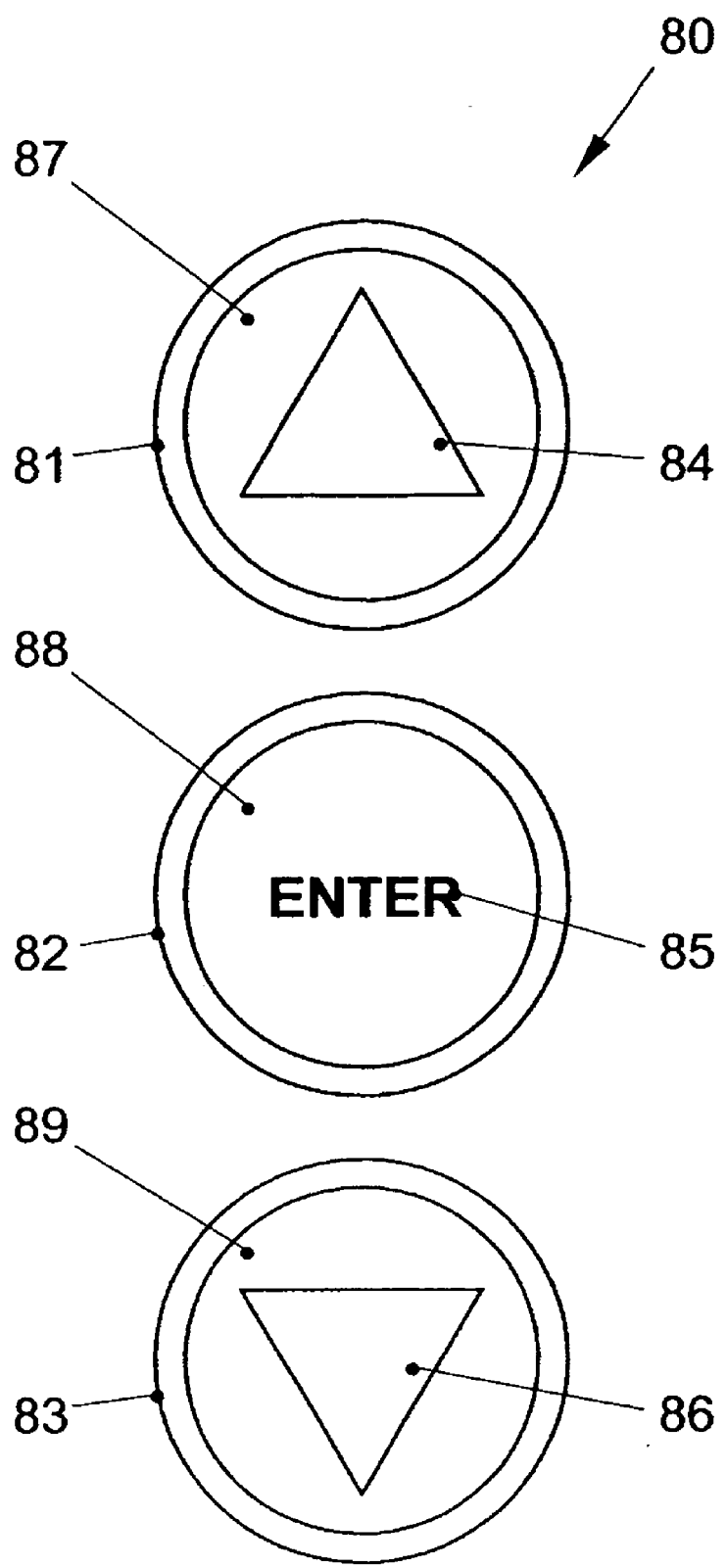
FIG. 19 shows a top view of the practical example of an operating element arrangement, usable for scrolling in the operating mode.

FIG. 19 shows a top view of a practical example of an operating element arrangement 80, usable for scrolling in the operating mode. The operating element arrangement 80 includes three operating elements 81, 82, 83, shown in the operating mode. The operating element 81, on whose operating surface 87 an upward pointing triangle 84 can be displayed, serves for scrolling up in a menu or as send selector. The operating element 83, on whose operating surface 89 a downward pointing triangle 86 can be displayed, serves for scrolling down in a menu or as send selector. The operating element 82, on whose operating surface 88 the word 85 "ENTER" can be displayed, for example, serves for selection of a selected menu point. In a send selector, the operating element 82 can remain in the rest mode. However, it can also be prescribed that the operating element 83 remains in the rest mode, and the function of the operating element 83 can be executed by means of operating element 82, in which a downward pointing triangle can be displayed on the operating surface 88 of operating element 82.

Figure 20:
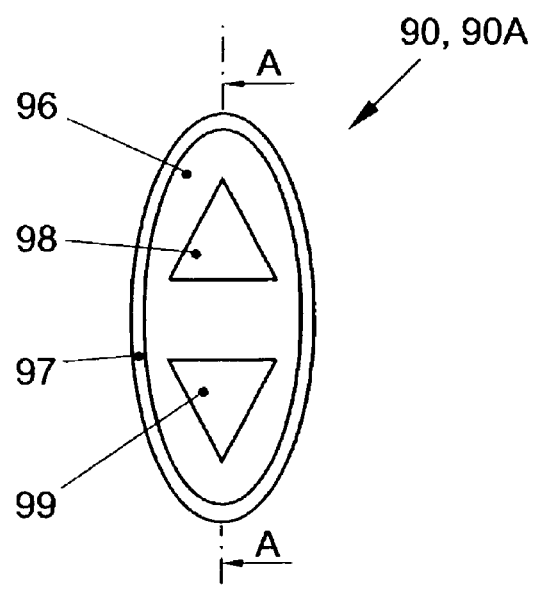
FIG. 20 shows the top view of the practical example of an operating element, usable for scrolling in the operating mode.
Figure 21:
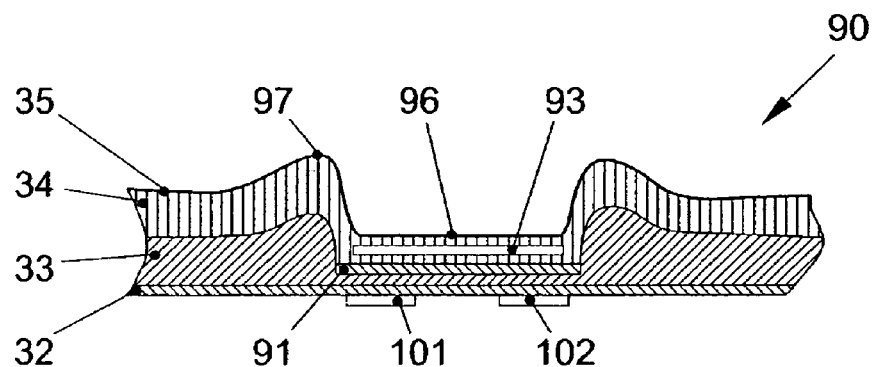
FIG. 21 shows a cross section through the operating element according to FIG. 20 in the operating mode.
Figure 22:
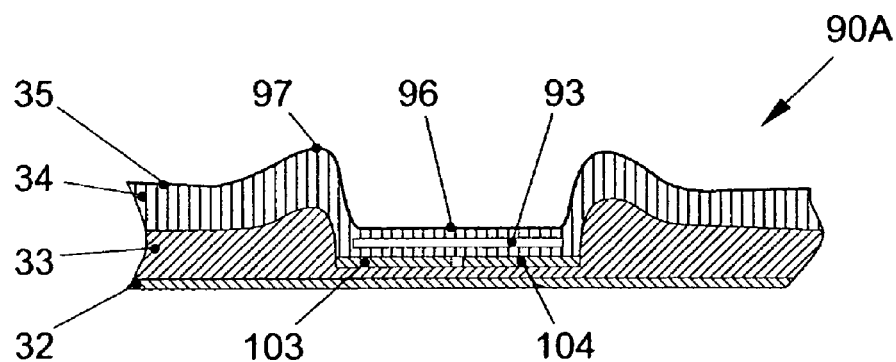
FIG. 22 shows a cross section through an alternative embodiment of the operating element according to FIG. 20 in the operating mode.

FIG. 20 shows a top view of a practical example of an operating element 90 or 90A, usable for scrolling in the operating mode, FIG. 21 shows a cross section through the operating element 90 according to FIG. 20 along line A-A and FIG. 22 shows a cross section through the operating element 90A according to FIG. 20 along line A-A.

The operating element 90 includes a front electrode 91 and a rear electrode 32, as well as a layer 33 arranged between front electrode 91 and rear electrode 32 from an especially nonionic dielectric elastomer. The front electrode 91 is configured as an elliptical surface. In addition, at least the front electrode 91 is elastic. Otherwise, the same reference numbers, as in all other practical examples and figures, denote the same or equivalent elements.

In the operating mode, from deformation of layer 33 above front electrode 91, an operating surface 96, recognizable and feelable by a recess, is formed, which is recognizable by the user as a key, pushbutton, etc. In addition, by deformation of layer 33, an annular bulge 97 is formed around the operating surface 96, which facilitates a user from recognizing or feeling the operating surface 96 as a key, pushbutton, etc.

The operating element 90 also has an elastic display device 93, by means of which a triangle 98 for scrolling up in a menu or a send selector and a triangle 99 for scrolling down in a menu or a send selector can be displayed in operating surface 96. The triangle 98 is a pressure sensor 101 for recording a pressure exerted on the operating surface 96 by a user. A pressure sensor 102 for recording a pressure exerted on the operating surface 96 in the region of triangle 99 by a user, on the other hand, is allocated to triangle 99.

The operating element 90A includes a front electrode, consisting of two segments 103 and 104 that can be exposed to the same voltage potential by means of a control (not shown). However, it is prescribed that different capacitance changes, caused by external pressure, can be determined individually for segments 103 and 104. A capacitance change between segment 103 and rear electrode 32 can then be allocated to a pressure exerted by a user on the operating surface 96 in the region of triangle 98 and a capacitance change between segment 104 and rear electrode 32 can be allocated to a pressure exerted by a user on the operating surface 96 in the region of triangle 99.

Figure 23:
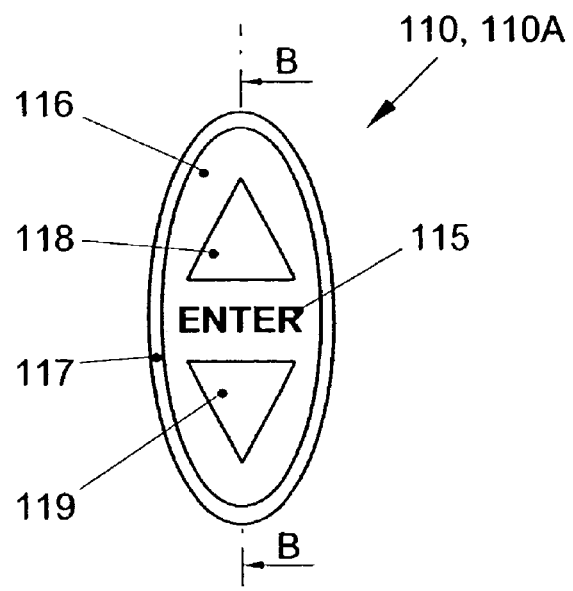
FIG. 23 shows a top view of another practical example of an operating element, usable for scrolling in the operating mode.
Figure 24:
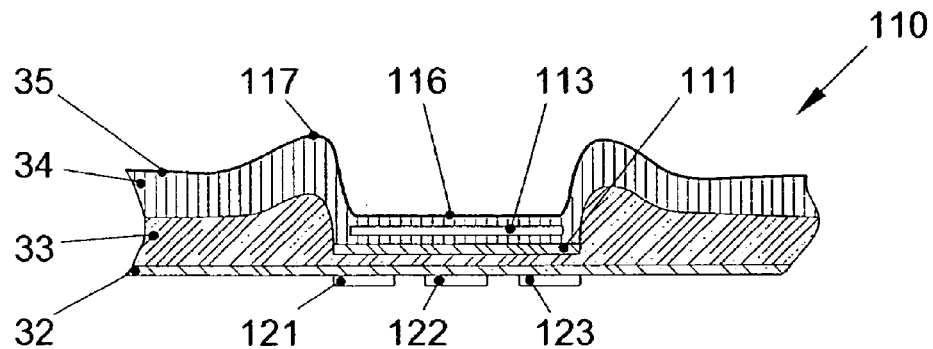
FIG. 24 shows a cross section through the operating element according to FIG. 23 in the operating mode.
Figure 25:
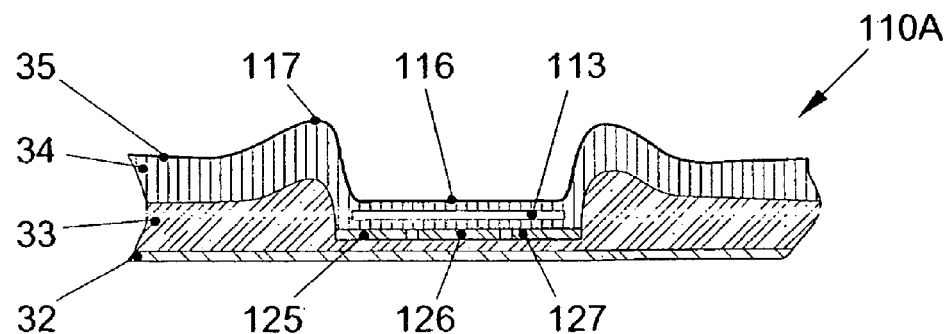
FIG. 25 shows a cross section through an alternative embodiment of the operating element according to FIG. 23 in the operating mode.

FIG. 23 shows a top view of a practical example of an operating element 110 or 110A, usable for scrolling in the operating mode, FIG. 24 shows a cross section through the operating element 110 according to FIG. 23 along line B-B and FIG. 25 shows a cross section through the operating element 110A according to FIG. 23 along line B-B.

The operating element 110 includes a front electrode 111 and a rear electrode 32, as well as a layer 33 arranged between front electrode 111 and rear electrode 32, made of an especially nonionic dielectric elastomer. The front electrode 111 is configured as an elliptical surface. In addition, at least the front electrode 111 is elastic. Otherwise, as in all other practical examples and figures, the same reference numbers denote the same or equivalent elements.

In the operating mode, an operating surface 116, recognizable and feelable by a recess, is formed by deformation of layer 33 above front electrode 111, which can be recognized by the user as a key, pushbutton, etc. In addition, by deformation of layer 33, an annular bulge 117 is formed around operating surface 116, which makes it easy for the user to recognize or feel the operating surface 116 as a key, pushbutton, etc.

The operating element 110 also has an elastic display device 113, by means of which a triangle 118 for scrolling up in a menu or a send selector and a triangle 119 for scrolling down in a menu or a send selector, as well as the word 115 "ENTER" for selection of a selected menu point, can be displayed in operating surface 116. A pressure sensor 121, to record a pressure exerted by a user on the operating surface 116 in the region of triangle 118, is allocated to triangle 118. On the other hand, a pressure sensor 123, to record a pressure exerted by a user on the operating surface 116 in the region of triangle 119, is allocated to triangle 119. For pressure sensor 122 to record a pressure exerted by a user on the operating surface 116 in the region of the word 115 "ENTER" is allocated to the word 115 "ENTER".

The operating element 110A includes a front electrode, consisting of three segments 125, 126 and 127, which can be exposed to the same voltage potential by means of a control (not shown). However, it is proposed that different capacitance changes, caused by external pressure, be determinable individually for segments 125, 126 and 127. A capacitance change between segment 125 and rear electrode 32 can then be assigned to a pressure exerted by the user on the operating surface 116 in the region of triangle 118. A capacitance change between segment 126 and the rear electrode 32 can be allocated to a pressure exerted by the user on the operating surface 116 in the region of the word 115 "ENTER", and a capacitance changer between segment 127 and rear electrode 32 can be allocated to a pressure exerted by a user on the operating surface 116 in the region of triangle 119.

By means of the operating elements proposed in FIG. 19 to FIG. 25, the wheel 11, according to DE 101 39 693 A1 (incorporated by reference), and the rotating knob 7, according to WO 00/27195 (incorporated by reference) can be replaced.

Figure 26:
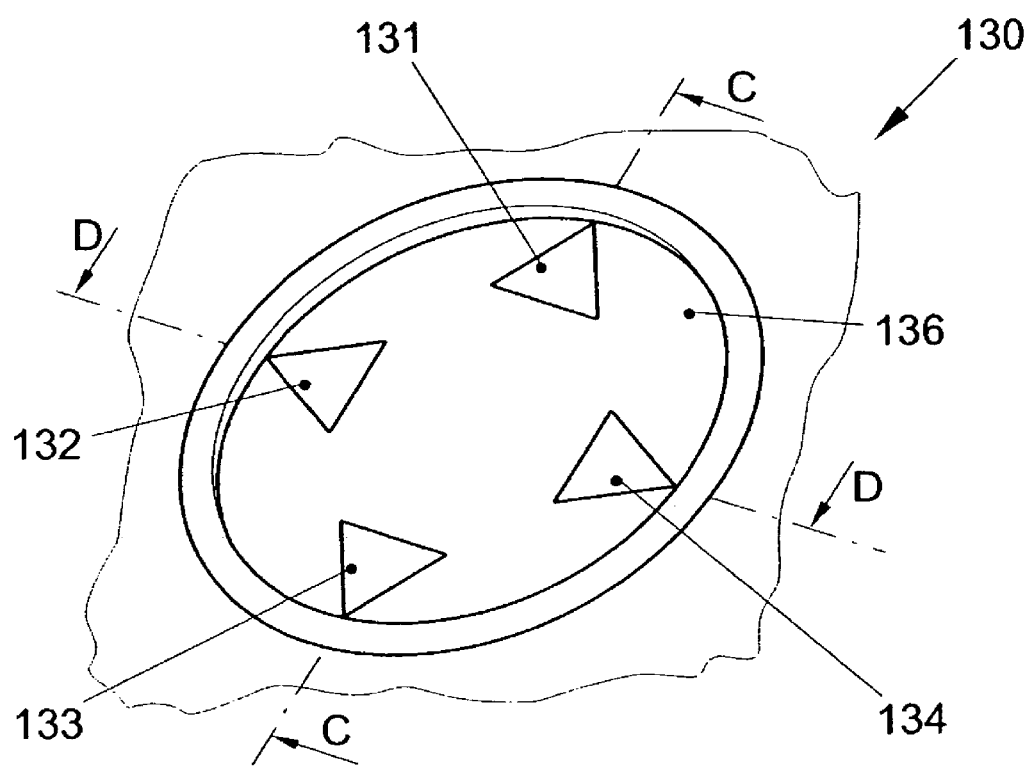
FIG. 26 shows a top view of another practical example of an operating element arrangement, usable for scrolling in the operating mode.

FIG. 26 shows a top view of another practical example of an operating element 130, usable for scrolling in the operating mode. Triangles 131, 132, 133 and 134 are shown on an operating surface 136 by means of an elastic display device (not shown). By pressure on triangles 131, 132, 133 and 134, a menu can be scrolled on a monitor (not shown). A cross section through the operating element 130 along line C-C and a cross section through the operating element 130 along line D-D can correspond to the cross sections depicted in FIGS. 21 and 22.

Figure 27:
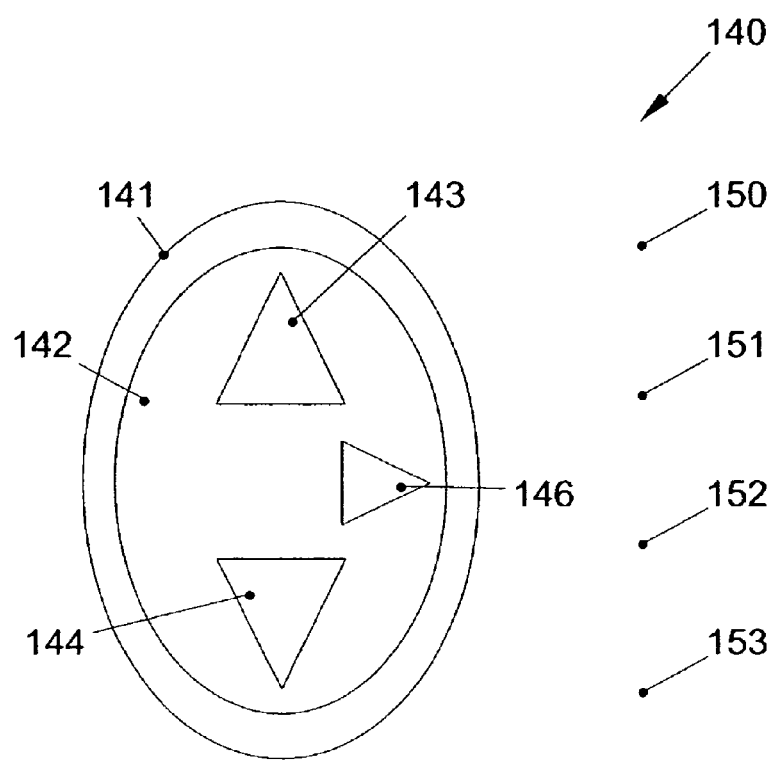
FIG. 27 shows a top view of another practical example of an operating element arrangement, usable for scrolling in the operating mode
Figure 28:
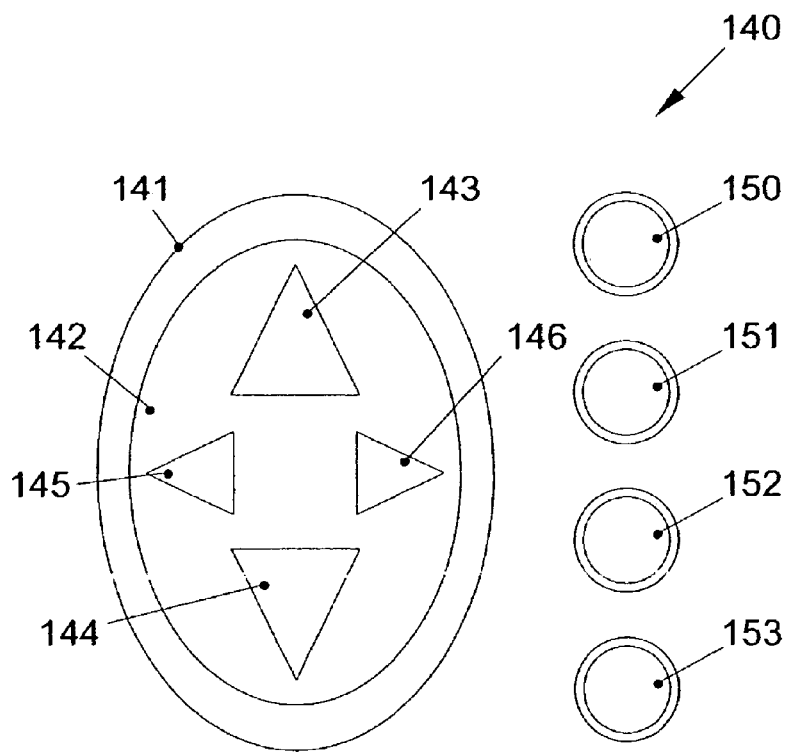
FIG. 28 shows a top view of a practical example of an operating element arrangement according to FIG. 27, usable for scrolling in another operating mode.
Figure 29:
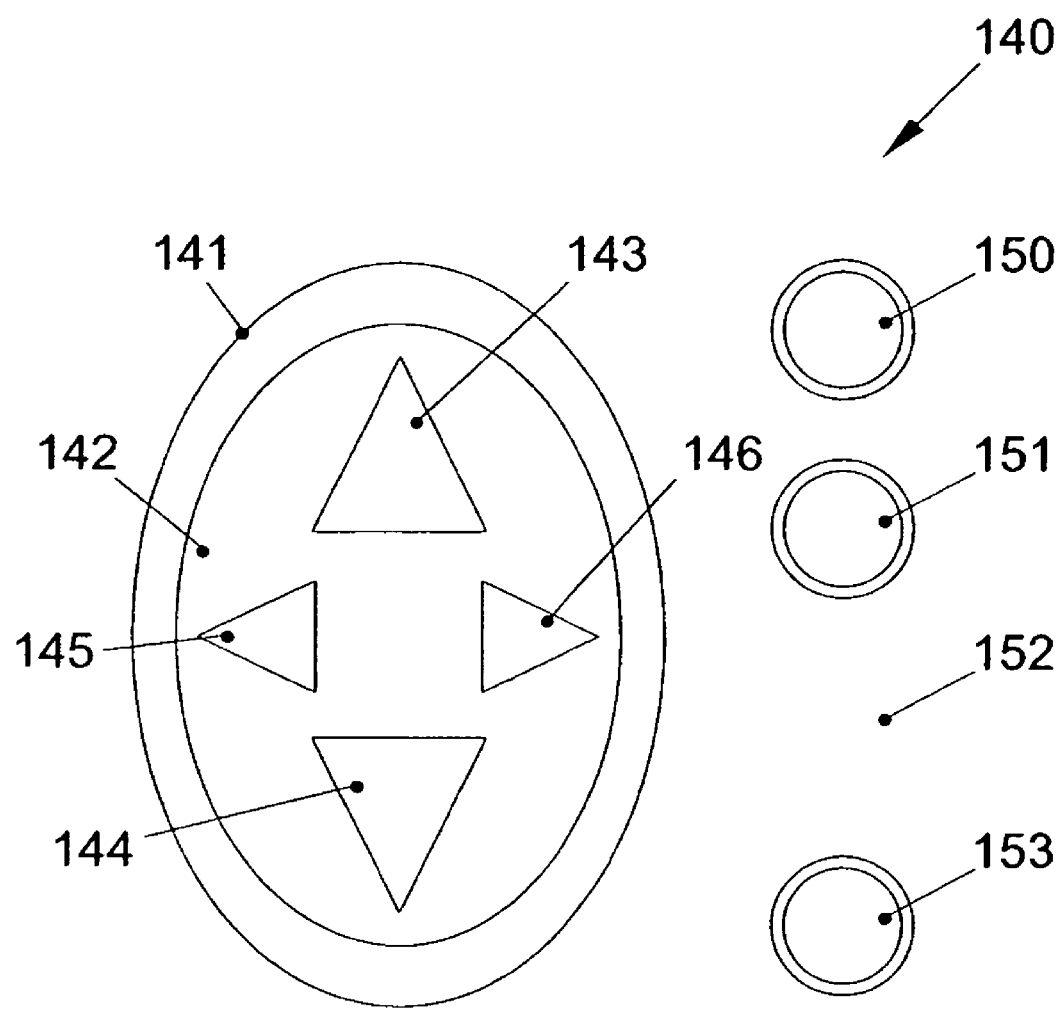
FIG. 29 shows another top view of the practical example of an operating element arrangement according to FIG. 27, usable for scrolling in another operating mode.

FIG. 27 shows a top view of a practical example of an operating element arrangement 140 for operation of a menu disclosed in DE 101 39 693 A1 in an operating mode. FIG. 28 and FIG. 29 each show a top view of the operating element arrangement 140 according to FIG. 27 in a different operating mode. Reference number 141 then denotes an operating element to replace elements 11, 12 and 13 according to DE 101 693 A1. Reference numbers 150, 151, 152 and 153 denote operating elements to replace the keys 36 according to DE 101 39 693 A1, in which the operating elements 150, 151, 152 and 153, in the configuration depicted in FIG. 27, have no function and are therefore also not recognizable to a user. Pressing of the operating surface 142 in the region of triangle 145 replaces operation of element 12 according to DE 101 39 693 A1. Pressing of the operating surface 142 in the region of triangle 146 replaces operation of element 13 according to DE 101 39 693 A1. Alternate pressing of operating surface 142 in the region of triangle 143 and 144 replaces operation (up or down rotation) of element 11 according to DE 101 39 693 A1.

FIG. 27 shows the operating element arrangement 140 in an operating mode, allocated to the uppermost menu mask in FIG. 6 of DE 101 39 693 A1. The operating elements 150, 151, 152 and 153 are in the rest mode and the triangle 145 does not display. FIG. 28 shows the operating element arrangement 140 in an operating mode, allocated to the second menu mask in FIG. 6 of DE 101 39 693 A1. FIG. 29 shows the operating element arrangement 140 in an operating mode, allocated to the lowermost menu mask in FIG. 6 of DE 101 39 693 A1. The operating element 152 is then in the rest mode.

Figure 30:
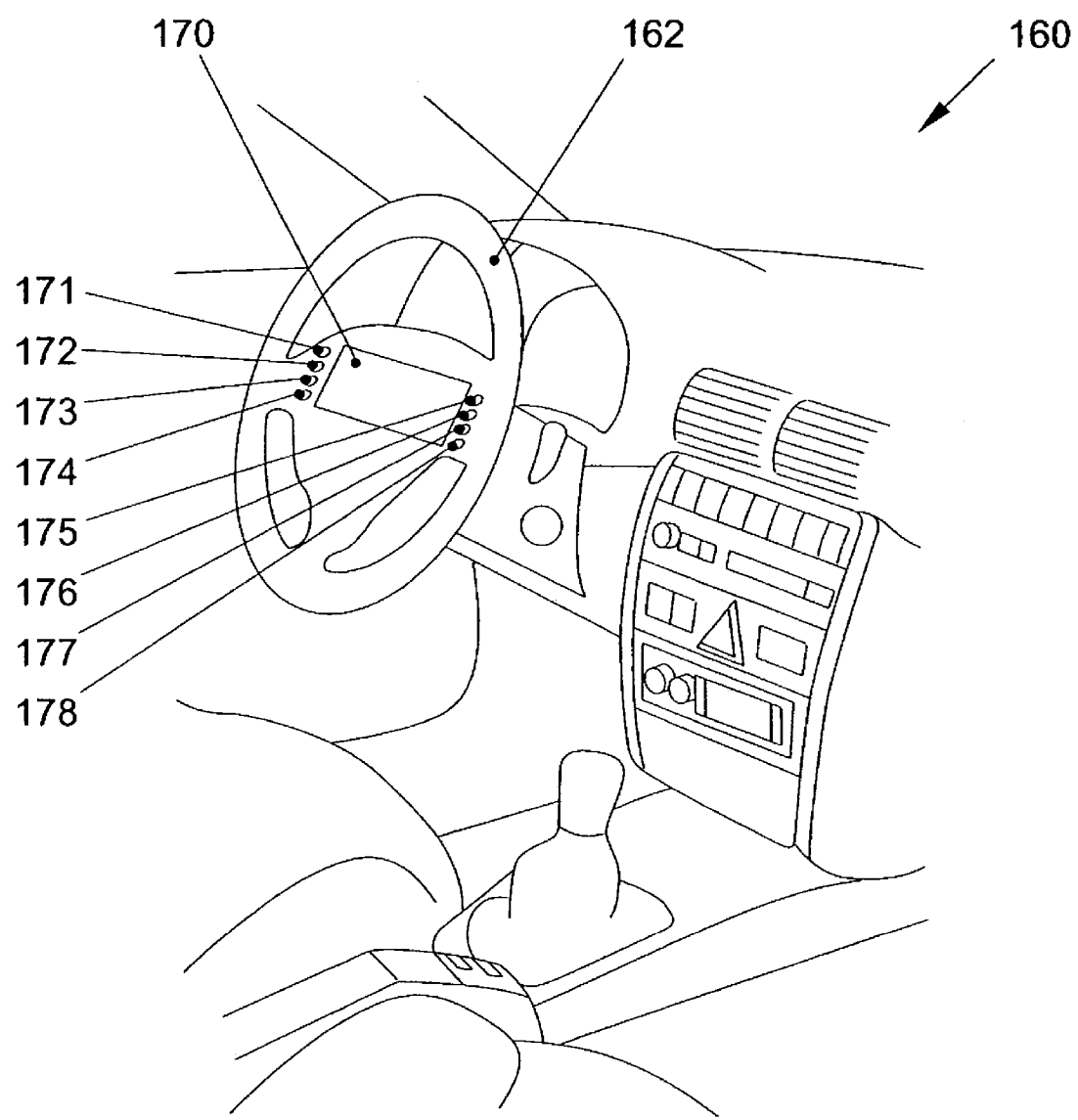
FIG. 30 shows another vehicle in an inside view.

FIG. 30 shows the vehicle 160 in an inside view. The vehicle 160 has a steering wheel 162 with a monitor 170 and with operating elements 171, 172, 173, 174, 175, 176, 177 and 178. Monitor 170 and the operating elements 171, 172, 173, 174, 175, 176, 177 and 178 can be, as explained with reference to the following figures, a component of an air conditioner, a navigation system, a telephone or at least an infotainment system, comprising one of these functions.

Figure 31:
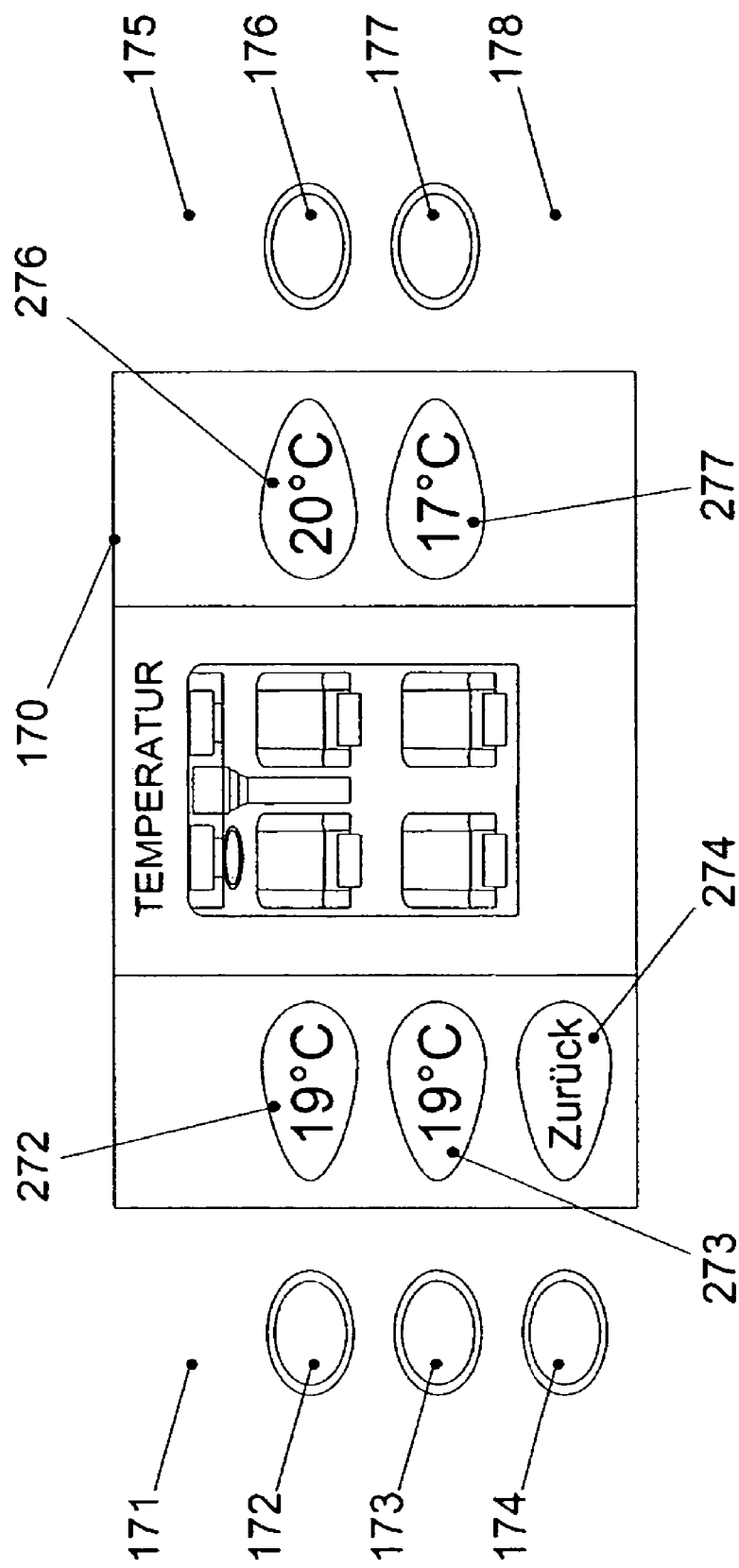
FIG. 31 shows a practical example for a mask for operation of an air conditioner.

FIG. 31 shows a practical example of a mask displayed on monitor 170 for operation of an air conditioner. In the mask depicted in FIG. 31, temperature readings of individual locations in the vehicle interior are shown, together with operating element functional data 272, 273, 274, 276, 277, to indicate the actual function of operating elements 172, 173, 174, 176, 177, in which the temperature data pertain to actually set temperatures that can be changed by operating elements 172, 173, 176 and 177. The operating elements 171, 175 and 178 are in the rest mode.

Figure 32:
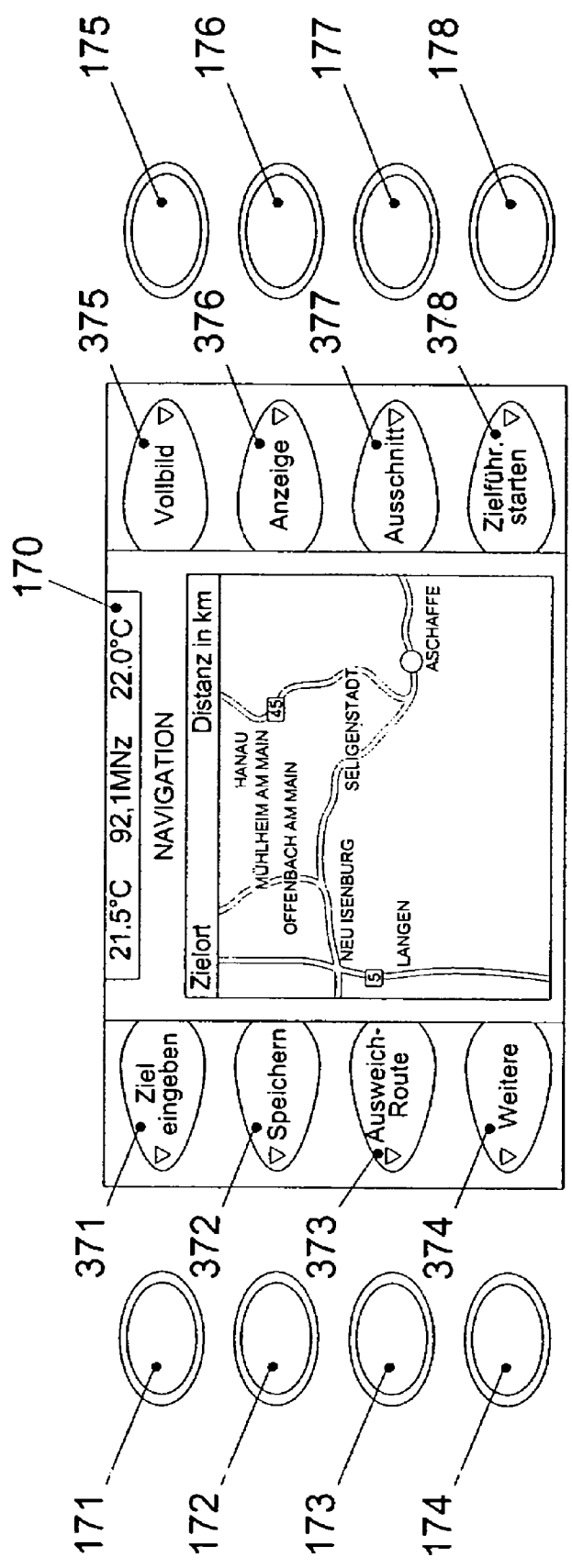
FIG. 32 shows a practical example for a mask for operation of a navigation system.
Figure 33:
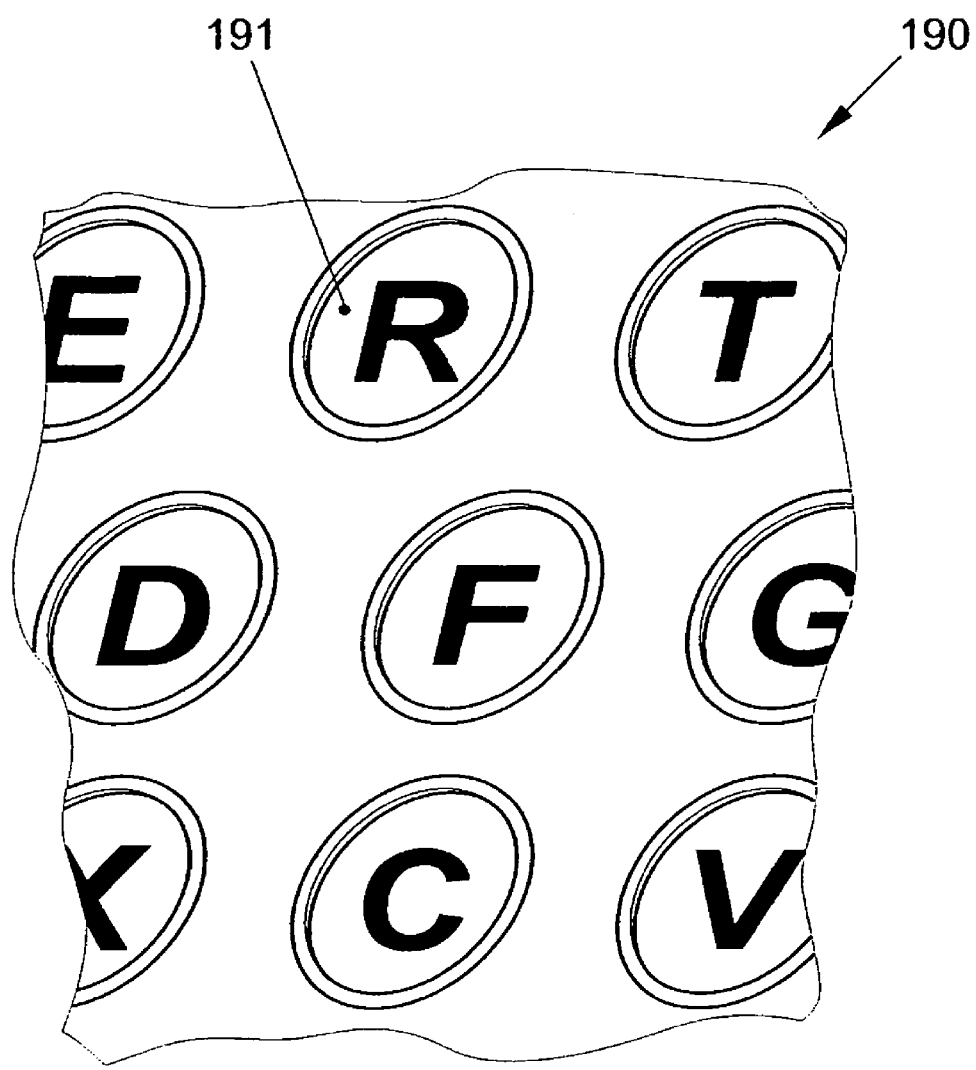
FIG. 33 shows an operating element arrangement, configured as an alpha-numeric keyboard in the operating mode.
Figure 35:
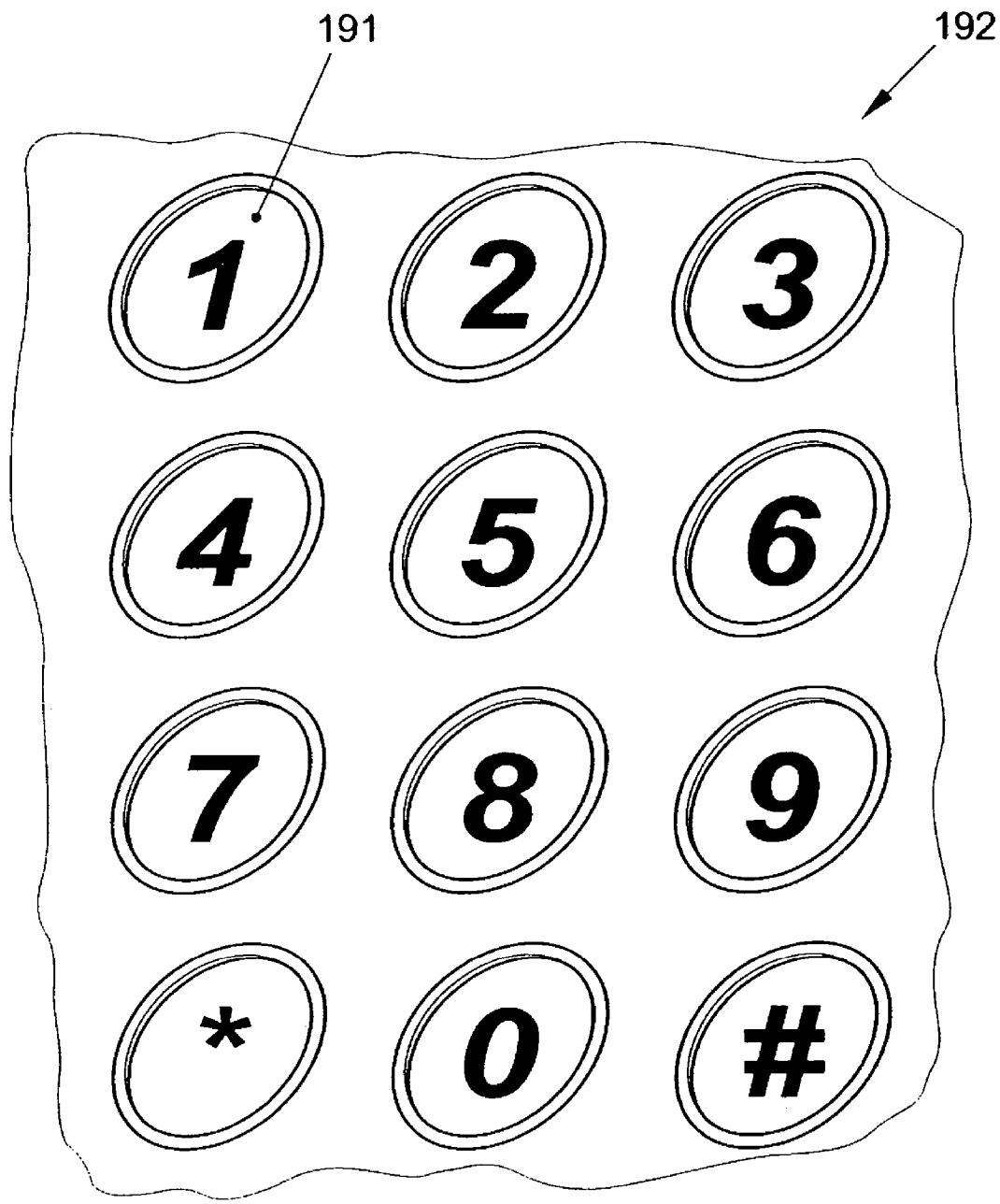
FIG. 35 shows an operating element arrangement, configured as an alpha-numeric keyboard in the operating mode.

FIG. 32 shows a practical example of a mask displayed on monitor 170 for operation of a navigation system. Reference numbers 371, 372, 373, 374, 375, 376, 377 and 378 denote operating element function data depicted on monitor 170, to indicate actual functions of operating elements 171, 172, 173, 174, 175, 176, 177 and 178. Additional operating elements 191 (depicted in FIGS. 33 and 35) can be provided beneath monitor 171, which assume an operating mode, in which an alphanumeric keyboard 190 for entry of a travel destination can be displayed (depicted in FIG. 33) by pressing the operating element 171 in the mask depicted in FIG. 32.

Figure 34:
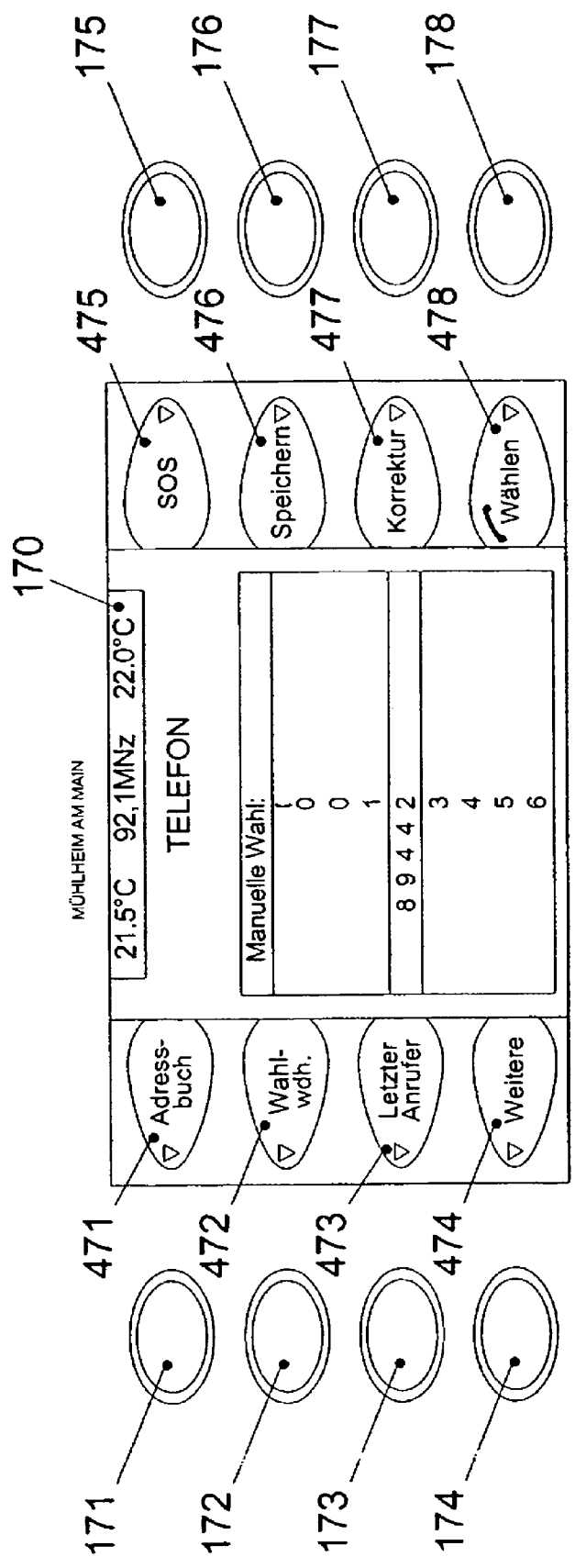
FIG. 34 shows a practical example for a mask for operation of a telephone.

FIG. 34 shows a practical example of a mask displayed on monitor 170 for operation of a telephone. Reference numbers 471, 472, 473, 474, 475, 476, 477 and 478 then denote operating element functional data displayed on monitor 170 to indicate the actual function of operating elements 171, 172, 173, 174, 175, 176, 177 and 178. The operating element 191, provided beneath monitor 170, on pressing of operating element 178 in the mask depicted in FIG. 34, assumes an operating mode, in which a numerical keyboard 192 for input of a telephone number can be displayed (depicted in FIG. 35).

The elements and layers in the figures are drawn in the interest of simplicity and clarity and not necessarily true to scale. For example, the orders of magnitude of some elements or layers are significantly exaggerated relative to other elements or layers, in order to improve understanding of the practical examples of the present invention.

We claim:

1. An operating element for a vehicle comprising a front electrode and a rear electrode, a layer comprising a dielectric elastomer arranged between the front electrode and the rear electrode, and at least one pressure sensor arranged on the side of the rear electrode facing away from said layer for measurement of a pressure exerted on an operating surface of the operating element, wherein the operating element is configured for manual operation of a function of the vehicle by pressing on the operating element or touching the operating element.

2. The operating element according to claim 1, wherein the dielectric elastomer is a nonionic dielectric elastomer.

3. The operating element according to claim 1, wherein the pressure sensor is arranged on a side of the rear electrode facing away from the layer having the dielectric elastomer.

4. An operating element according to claim 1, wherein the operating element comprises at least one capacitance measurement device for measurement of an electric capacitance formed between the front electrode and the rear electrode.

5. The operating element according to claim 4, wherein the front and/or rear electrode is configured flat.

6. The operating element according to claim 1, wherein at least the front electrode is elastic.

7. The operating element according to claim 1, wherein the front and/or rear electrode is configured flat.

8. The operating element according to claim 1, wherein at least the front electrode is configured as a round surface.

9. The operating element according to claim 1, wherein at least the front electrode is configured as an elliptical surface.

10. The operating element according to claim 1, wherein at least the front electrode is configured as a ring.

11. The operating element according to claim 10, wherein at least the front electrode is configured as a circular ring.

12. The operating element according to claim 11, wherein at least the front electrode is configured as the circular ring with at least one straight inside and/or at least one straight outside.

13. The operating element according to claim 1, wherein at least one cover layer is arranged on a side of the front electrode facing away from the layer having the dielectric elastomer.

14. The operating element according to claim 13, wherein the cover layer is configured light-conducting or light transparent, at least in areas.

15. The operating element according to claim 1, wherein at least one protective layer is arranged on a side of the cover layer facing away from the front electrode.

16. The operating element according to claim 1, wherein a control is allocated to the operating element, by means of which the operating element can be raised either spatially from a visible surface or occluded with the visible surface as a function of an operating state of vehicle, a module of vehicle and/or a display device allocated to vehicle, so that it is essentially invisible and/or essentially cannot be felt by a user.

17. A keyboard, especially for a vehicle, wherein it has an operating element according to claim 1.

18. The keyboard according to claim 17, wherein the keyboard is designed as a numerical keyboard.

19. The keyboard according to claim 17, wherein the keyboard is designed as an alphanumeric keyboard.

20. An operating element for a vehicle for operation according to claim 1, further comprising at least a second operating element comprising a front electrode and a rear electrode, as well as a layer comprising a dielectric elastomer arranged between the front electrode and the rear electrode.

21. The operating element arrangement according to claim 20, wherein the two operating elements are configured as a common operating element that cooperates for scrolling in a menu that can be displayed on a display device.

22. An operating element for a vehicle comprising a front electrode, a rear electrode, and a layer comprising a dielectric elastomer arranged between the front electrode and the rear electrode, wherein at least the front electrode is configured as an elliptical ring which is inserted into said dielectric elastomer and wherein the operating element is configured for manual operation of a function of the vehicle by pressing on the operating element or touching the operating element.

23. The operating element according to claim 22, wherein at least the front electrode is configured as the elliptical ring with at least one straight inside and/or at least one straight outside.

24. An operating element for a vehicle, according to claim 1, wherein the operating element is arranged in a visible surface in the interior of the vehicle, and wherein a control is allocated to the operating element, by means of which the operating element can be raised either spatially from the visible surface or occluded with the visible surface as a function of an operating state of the vehicle, a module of the vehicle and/or a display device allocated to the vehicle, so that it is essentially invisible to a user and/or essentially cannot be felt.

25. The operating element according to claim 24, wherein a display device is allocated to the operating element to display the function of the operating element.

26. The operating element according to claim 24, wherein the operating element has a display device to display the function of operating element.

27. The operating element according to claim 26, wherein the display device is elastic.

28. The operating element according to claim 26, wherein the display device is arranged beneath the operating surface.

* * * * *